(12) United States Patent
Ho et al.

(10) Patent No.: US 7,808,069 B2
(45) Date of Patent: Oct. 5, 2010

(54) ROBUST STRUCTURE FOR HVPW SCHOTTKY DIODE

(75) Inventors: Dah-Chuen Ho, Taichung (TW); Chien-Shao Tang, Hsinchu (TW); Yu-Chang Jong, Hsinchu (TW); Zhe-Yi Wang, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 99 days.

(21) Appl. No.: 12/347,478

(22) Filed: Dec. 31, 2008

(65) Prior Publication Data

US 2010/0164050 A1    Jul. 1, 2010

(51) Int. Cl.
*H01L 27/095* (2006.01)
(52) U.S. Cl. .............................. 257/484; 257/E29.338; 438/570
(58) Field of Classification Search ................ 257/484, 257/E29.388; 438/570
See application file for complete search history.

(56) References Cited

U.S. PATENT DOCUMENTS

| 4,874,714 | A | 10/1989 | Eklund |
| 6,583,485 | B2 | 6/2003 | Epke |
| 6,653,707 | B1 | 11/2003 | Sawdai et al. |
| 6,885,077 | B2 | 4/2005 | Dietl et al. |
| 7,071,518 | B2 | 7/2006 | Parthasarathy et al. |
| 7,279,390 | B2 | 10/2007 | Duskin et al. |
| 2008/0135970 | A1* | 6/2008 | Kim et al. .................. 257/471 |

\* cited by examiner

*Primary Examiner*—Mark Prenty
(74) *Attorney, Agent, or Firm*—Duane Morris LLP

(57) ABSTRACT

A high-voltage Schottky diode including a deep P-well having a first width is formed on the semiconductor substrate. A doped P-well is disposed over the deep P-well and has a second width that is less than the width of the deep P-well. An M-type guard ring is formed around the upper surface of the second doped well, A Schottky metal is disposed on an upper surface of the second doped well and the N-type guard ring.

22 Claims, 3 Drawing Sheets

US 7,808,069 B2

ROBUST STRUCTURE FOR HVPW SCHOTTKY DIODE

FIELD OF THE DISCLOSURE

The disclosure relates to semiconductor diodes, and more specifically, the disclosure relates to a Schottky diode.

BACKGROUND

Applying a metal layer to a surface of a doped semiconductor material, e.g., a layer enriched or depleted of carrier charges, creates a contact region having properties comparable to a pn-j unction in a semiconductor material. The common name for this metal-semiconductor contact region is a Schottky diode. The ability of Schottky diodes to substantially restrict current flow to one direction is a property heavily relied upon in the manufacture and design of integrated circuits. When forward biased, a Schottky diode is in an "on" state and current flows through the diode. When the diode is reverse biased, a Schottky diode is in an "off" state and ideally will, not allow current to flow. However, Schottky diodes are not ideal, and thus experience a small amount of reverse leakage current, which flows back through the diode when the diode should not be conducting current.

Reverse leakage is detrimental to the performance of a circuit and results in a loss of power in the circuit. A portion of the reverse leakage current arises from the physical junction interaction between the Schottky metal, or Schottky barrier, and an adjacent semiconductor material Regardless of its source, reverse leakage current induces undesirable characteristics in the operation of an electronic device, reducing efficiency.

The breakdown voltage of a Schottky diode is the maximum amount of reverse voltage that may be applied to the diode before the diode begins to breakdown aid experiences an exponential increase in reverse leakage current. The ability to apply a greater reverse voltage to a Schottky diode without the diode breaking down (greater breakdown voltage) enables the diode to be integrated into circuits for higher voltage applications, e.g., applications haying voltage levels that exceed a few volts.

Accordingly, a Schottky diode for high-voltage applications with low reverse leakage current is desired.

SUMMARY OF THE INVENTION

In some embodiments, a Schottky diode comprises a semiconductor substrate and a deep P-well formed on the semiconductor substrate. The deep P-well has a first width. A doped P-well is disposed over the deep P-well and has a second width. The second width is less than the first width. An N-type guard ring is formed around the upper surface of the doped P-well. A Schottky metal is disposed on an upper surface of the doped P-well.

In some embodiments, a Schottky diode comprises a deep P-well having a depth of approximately 2 μm formed in a semiconductor substrate. A P-well is formed over and contacts the deep P-well The P-well has a width dimension that is less than a width dimension of the deep P-well. An N-type guard ring is formed in an upper surface of the P-well. A Schottky metal is disposed over and contacts the P-well and the N-type guard ring.

In some embodiments, a method comprises the steps of forming a deep P-well over a semiconductor substrate and forming a doped P-well over the deep P-well. The doped P-well has a width that is less than a width of the deep P-well. The method includes forming an N-type guard ring around an upper surface of the doped P-well and disposing a Schottky metal on the upper surface of the doped P-well.

DETAILED DESCRIPTION

Figure 1:
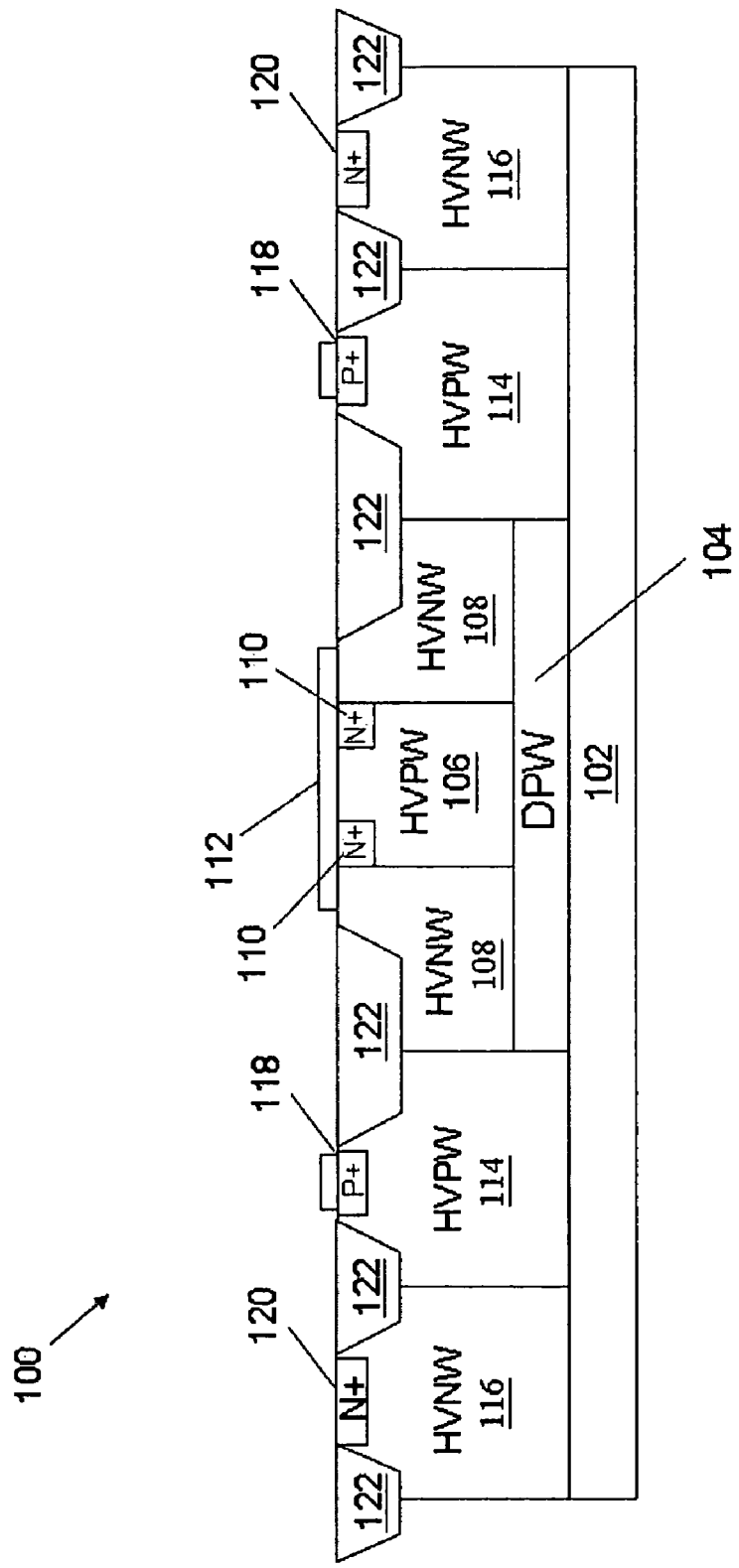
FIG. 1 illustrates a cross-sectional view of a high-voltage Schottky diode.
Figure 2:
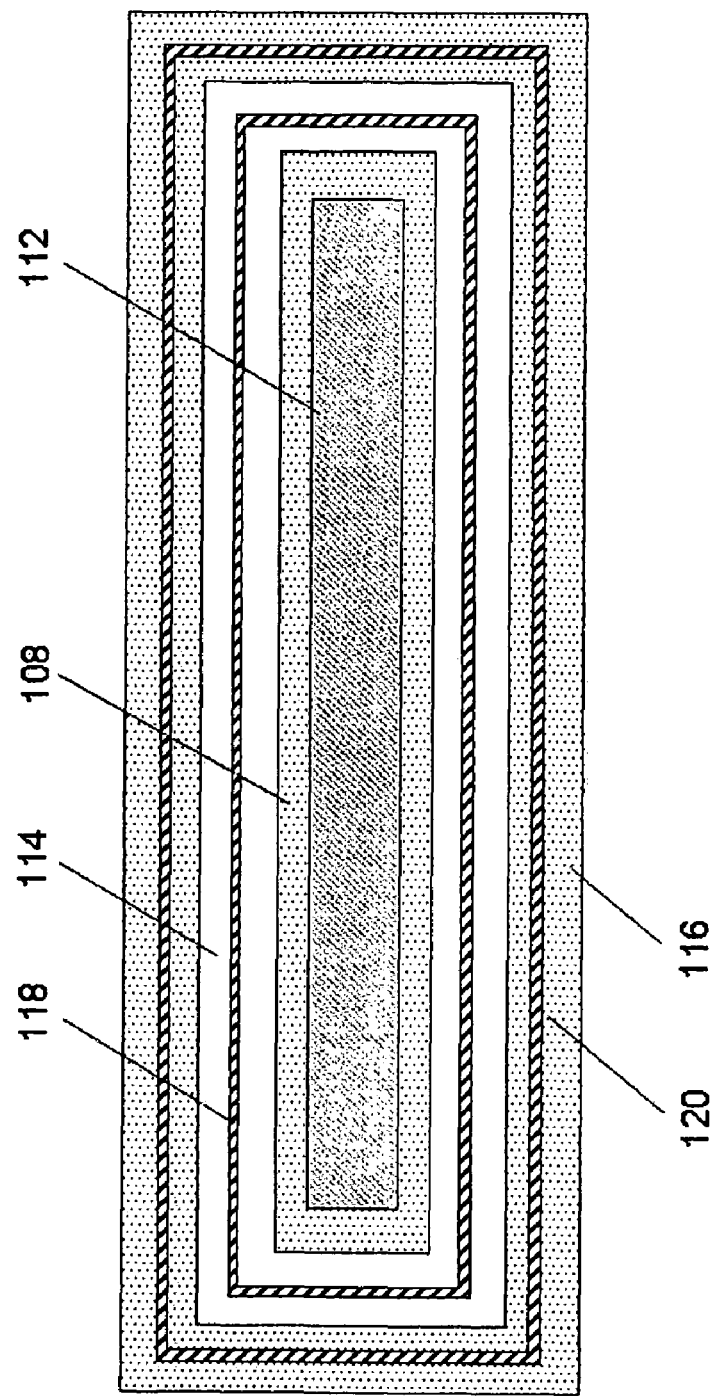
FIG. 2 is a top view of the high-voltage Schottky diode as shown in FIG. 1.

With reference to FIGS. 1 and 2, an improved Schottky diode 100 is now described. FIG. 1 illustrates a cross-sectional view of a Schottky diode 100, and FIG. 2 is a top view of the Schottky diode 100 illustrated in FIG. 1. High voltage (HV) Schottky diode 100 is formed on a semiconductor substrate 102 and includes a deep P-well 104 formed above the semiconductor substrate 102. In one embodiment, deep P-well 104 has a depth of approximately 2 μm, a width of approximately 8.8 μm and a doping concentration of approximately 1.6e16 (cm$^{-3}$).

Substrate 102 may be any of a variety of substrate materials, including a silicon substrate, a Group III-V compound substrate, a silicon/germanium (SiGe) substrate, a silicon-on insulator (SOI) substrate, or the like. An N-type buried layer (NBL) (not shown), which acts as a barrier layer between the semiconductor substrate 102 and the layers above the substrate forming the Schottky diode 100, may be formed on the upper surface of semiconductor substrate 102.

Deep P-well 104 may be doped with any suitable P-type dopant such as, for example, boron, gallium, aluminum, or any Group III element. A high-voltage P-well (HVPW) 106 is formed between high-voltage N-wells (HVNW) 108 over deep P-well 104. In one embodiment, HVPW 106 has a width of approximately 1.6 μm to approximately 2.4 μm and a doping concentration of approximately 1.6e16 (cm$^{-3}$) of boron, gallium, or any suitable P-type dopant. HVNW 108 may have a width of approximately 3.2 μm and have a doping concentration of approximately 1.6e16 (cm$^3$). HVNW 108 may be doped with a suitable N-type dopant such as arsenic, phosphorus, antimony, or other Group V element. At the upper surface of HVPW 106 are doped N+ regions 110. Doped N+ regions 110 may also be doped with a suitable N-type dopant until they have a doping concentration of about 1e19 (cm$^{-3}$) to about 1e20 (cm$^{-3}$). In some embodiments, doped N+ regions 110 may have a width of approximately 0.44 μm, although one skilled in the art will understand that doped N+ regions 110 may have other dimensions.

A Schottky barrier 112 is disposed on top of HVPW 106 and may extend from HVPW 106 across the doped N+ regions 110 to HVNW 108. In one embodiment, the Schottky barrier 112 has a width of approximately 6 μm and a length of approximately 85 μm as best seen in FIG. 2. The doped N+ regions act as a guard ring to reduce leakage from the Schottky junction between HVPW 106 and Schottky barrier 112. Schottky barrier 112 may be formed from any suitable metal or combination of metals such as Al, Mo, W, Pt, Pd, Ag, An, Ti, Ni, NiFe, or Co. In some embodiments, a combination of Ti and Co is used as Schottky metal 112.

HVPW 114 is disposed above N-type semiconductor substrate 102 and adjacent to HVNW 108 and deep P-well 104. A doped P+ region 118 is formed at the upper surface of HVPW 114. Doped P+ region 118 may have a doping concentration of about 1e19 (cm$^{-3}$) to about 1e20 (cm$^{-3}$) and P+ regions may be doped with any suitable P-type dopant. In some embodiments, HVPW 114 has a width of approximately 4 µm although one skilled in the art will understand that HVPW 114 may have other widths.

HVNW 116 is formed above semiconductor substrate 102 and adjacent to HVPW 114. A doped N+ region 120 is formed at die upper surface of HVNW 116 and may serve as an electrical contact to connect to other circuit elements. Doped N+ region 120 may have a doping concentration of about 1e19 (cm$^{-3}$) to about 1e20 (cm$^{-3}$). In some embodiments, HVPW 114 and HVNW 116 have doping concentrations of approximately 1e16 (cm$^{-3}$), however, other doping concentrations may be used, insulating or dielectric regions 122 are formed at the upper surfaces of HVNW 114 and HVPW 116, Insulating regions 122 may include a layer of tetraethyl orthosilicate (TEGS), silicon nitride (SiN), silicon oxynitride (SIGN), silicon carbide (SiC), silicon dioxide (SiO$_2$), or the like.

Figure 3:
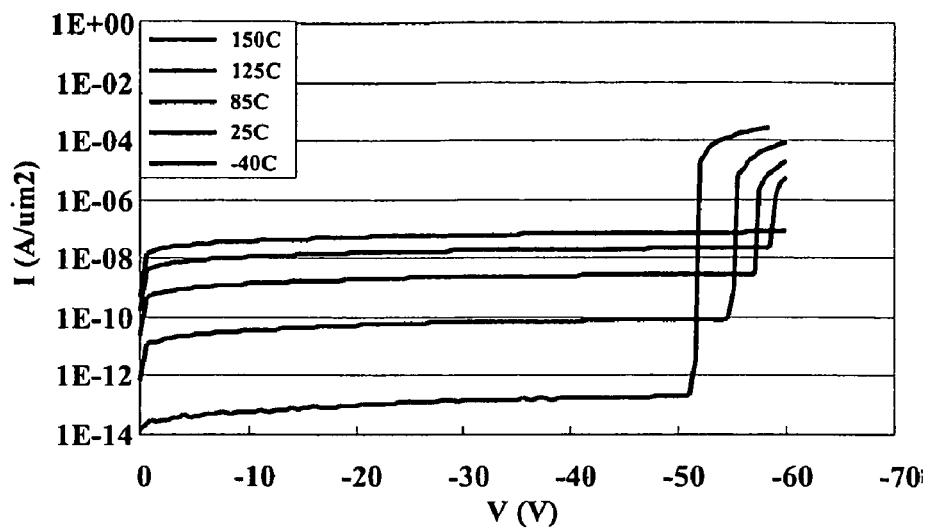
FIG. 3 is a graph with several plots of leakage current density versus voltage of a reversed biased high-voltage Schottky diode at various operating temperatures in accordance with the embodiment shown in FIG. 1.
Figure 4:
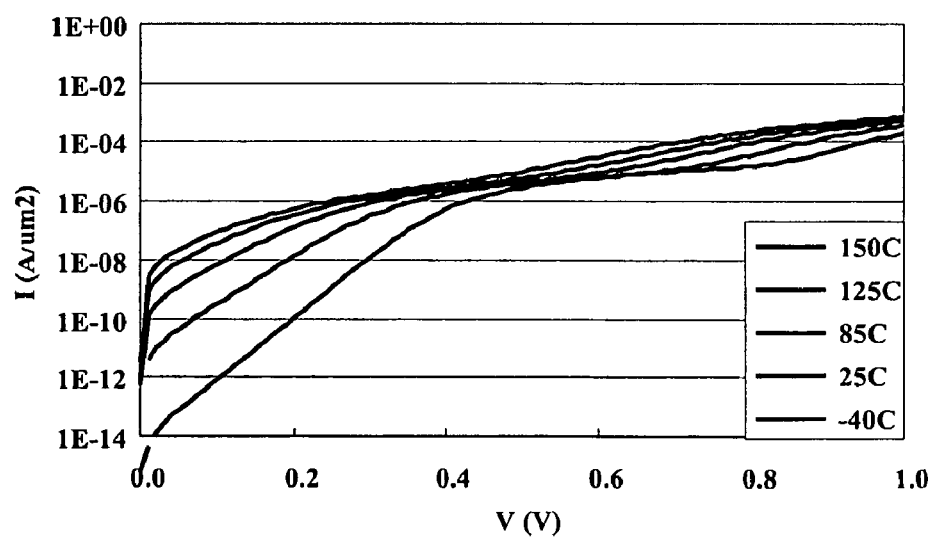
FIG. 4 is a graph with several plots of current density versus voltage of a forward biased high-voltage Schottky diode in accordance with the embodiment shown in FIG. 1.

In operation, the contact surfaces between Schottky barrier 112 and the HVPW 106 of Schottky diode 100 will pinch off and prevent current from flowing between the two regions 120, as do the contact surfaces between HVNW 108 and deep P-well 104 when a reverse voltage is applied to Schottky diode 100. The guard ring formed by N+ regions 110 also serves to limit the amount of current which flows through Schottky diode 100 when reverse biased. FIG. 2 illustrates several plots of the reverse leakage current through Schottky diode 100 at operating temperatures of –40 C, 25 C, 85 C, 125 C, and 150 C; As shown in FIG. 3, the Schottky diode has a reverse leakage current density of approximately 1e-10 A/µm$^2$ and a breakdown voltage of –55 volts when operating at room temperature. When a forward voltage is applied to Schottky diode 100, current flows through HVPW 106. FIG. 4 illustrates plots of the forward leakage current density through Schottky diode 100 at operating temperatures of –40 C, 25 C, 85 C, 125 C, and 150 C. As shown in FIG. 4, the current density through Schottky diode 100 quickly increases when a forward voltage is applied to the diode.

The Schottky diode 100 may be fabricated by performing a series of ion implantations. For example, photoresist may be deposited over a dielectric layer, which is then patterned. The exposed regions of the dielectric layer may then be etched to form a mask over the semiconductor substrate 102. The exposed regions of the semiconductor substrate are implanted with an N-type dopant to form the HVNWs 108, 116. The mask may be removed and another dielectric layer may be formed over the substrate 102. Photoresist may again be deposited over the dielectric layer and developed. The dielectric, layer may be etched to form a mask. P-type dopants such as, for example, boron, gallium, aluminum, or any Group 111 element may be implanted to form HVPWs 106, 114. The mask is then removed.

The deep P-well 104 may be formed by depositing and patterning a dielectric layer to form a mask. The exposed areas are then implanted with a P-type dopant. In some embodiments, the deep P-well is formed using a high energy implantation of approximately 2000 KeV. The mask for the deep P-well is removed and the mask for forming the N+ regions 110, 120 is formed. With tire mask in place, the N+ regions 110, 120 are formed by implanting an N-type dopant.

The mask is removed once the N+ regions 110, 120 have been formed, and a mask is fanned for the P+ regions 118. The P+ regions are formed by implanting a Ptype dopant in the P+ regions 118. Once the P+ regions 118 have been formed, the mask is removed and the Schottky barrier is then formed over the N+ regions 110, the HVPW 106, and a portion of the HVNW 108.

Although the invention has been described in terms of exemplary embodiments, it is not limited thereto. Rather, the appended claims should be construed broadly, to include other variants and embodiments of the invention, which may be made by those skilled in the art without, departing from the scope and range of equivalents of the invention.

What is claimed is:

1. A semiconductor device, comprising:
   a semiconductor substrate;
   a deep P-well formed on the semiconductor substrate, the deep P-well having a first width;
   a doped P-well disposed over the deep P-well, the doped P-well having a second width that is less than the first width;
   an N-type guard ring formed around the upper surface of the doped P-well; and
   a Schottky metal disposed on an upper surface of the doped P-well.

2. The semiconductor device of claim 1, wherein the Schottky metal comprises titanium and cobalt.

3. The semiconductor device of claim 1, wherein the N-type guard ring comprises a highly doped N-type diffusion region.

4. The semiconductor device of claim 1, further comprising a first high voltage N-well formed around the doped P-well.

5. The semiconductor device of claim 4, further comprising a high voltage P-well formed around the first high voltage N-well.

6. The semiconductor device of claim 5, further comprising a second high voltage N-well formed around the high voltage P-well.

7. The semiconductor device of claim 6, further comprising a highly doped P-type region formed in the high voltage P-well.

8. The semiconductor device of claim 6, further comprising a second highly doped N-type region formed in the second high voltage N-well.

9. The semiconductor device of claim 1, wherein the width of the doped P-well is approximately 1.6 µm.

10. The semiconductor device of claim 9, wherein the doping concentration of the deep P-well and doped P-well is about 1e16 (cm-3).

11. The semiconductor device of claim 10, wherein the N-type guard ring has a doping concentration from about 1e19 (cm-3) to about 1e20 (cm-3).

12. The semiconductor device of claim 1, wherein the deep P-well has a depth of approximately 2 µm.

13. A semiconductor device, comprising:
   a deep P-well having a depth of approximately 2 µm formed in a semiconductor substrate;
   a P-well formed over and contacting the deep P-well, the P-well having a width dimension less than a width dimension of the deep P-well;
   an N-type guard ring formed in an upper surface of the P-well; and
   a Schottky metal disposed over and contacting the P-well and N-type guard ring.

14. The semiconductor device of claim 13, wherein the deep P-well has a doping concentration of approximately 1e16 (cm-3).

15. The semiconductor device of claim 14, wherein the doped P-well has a doping concentration of approximately 1e16 (cm-3).

16. The semiconductor device of claim 15, wherein the P-well width dimension is approximately 1.6 µm.

17. The semiconductor device of claim 16, wherein the N-type guard ring has a doping concentration of approximately 1e19 (cm-3) to about 1e20 (cm-3).

18. A method of forming the semiconductor device of claim 1, comprising:
 forming the deep P-well over the semiconductor substrate;
 forming the doped P-well over the deep P-well;
 forming the N-type guard ring around the upper surface of the doped P-well; and
 disposing the Schottky metal on the upper surface of the doped P-well.

19. The method of claim 18, wherein the Schottky metal comprises titanium and cobalt.

20. The method of claim 18, wherein the N-type guard ring is a highly doped N-type diffusion region.

21. The method of claim 18, further comprising:
 forming a first high voltage N-well formed around the doped P-well; and
 forming a high voltage P-well formed around the first high voltage N-well.

22. The method of claim 21, further comprising:
 forming a second high voltage N-well around the high voltage P-well.

* * * * *

UNITED STATES PATENT AND TRADEMARK OFFICE
CERTIFICATE OF CORRECTION

PATENT NO. : 7,808,069 B2
APPLICATION NO. : 12/347478
DATED : October 5, 2010
INVENTOR(S) : Dah-Chuen Ho et al.

It is certified that error appears in the above-identified patent and that said Letters Patent is hereby corrected as shown below:

Column 1, Line 14, delete "pn-j unction" and insert -- pn-junction -- therefor.

Column 1, Line 22, delete "hot" and insert -- not -- therefor.

Column 1, Line 30, delete "material Regardless" and insert -- material. Regardless -- therefor.

Column 1, Line 36, delete "aid" and insert -- and -- therefor.

Column 1, Line 41, delete "haying" and insert -- having -- therefor.

Column 1, Line 59, delete "P-well The" and insert -- P-well. The -- therefor.

Column 3, Line 20, delete "used, insulating" and insert -- used. Insulating -- therefor.

Column 3, Line 24, delete "(SIGN)" and insert -- (SiON) -- therefor.

Column 3, Line 66, delete "tire" and insert -- the -- therefor.

Column 4, Line 2, delete "fanned" and insert -- formed -- therefor.

Column 4, Line 3, delete "Ptype" and insert -- P-type -- therefor.

Signed and Sealed this

Twenty-first Day of December, 2010

David J. Kappos
*Director of the United States Patent and Trademark Office*